(12) United States Patent
Jeanneret

(10) Patent No.: US 11,880,165 B2
(45) Date of Patent: Jan. 23, 2024

(54) METHOD FOR MANUFACTURING SILICON TIMEPIECE COMPONENTS

(71) Applicant: PATEK PHILIPPE SA GENEVE, Genèva (CH)

(72) Inventor: Sylvain Jeanneret, Colombier (CH)

(73) Assignee: PATEK PHILIPPE SA GENEVE, Geneva (CH)

( * ) Notice: Subject to any disclaimer, the term of this patent is extended or adjusted under 35 U.S.C. 154(b) by 700 days.

(21) Appl. No.: 16/980,126

(22) PCT Filed: Mar. 19, 2019

(86) PCT No.: PCT/IB2019/052198
§ 371 (c)(1),
(2) Date: Sep. 11, 2020

(87) PCT Pub. No.: WO2019/180596
PCT Pub. Date: Sep. 26, 2019

(65) Prior Publication Data
US 2021/0026299 A1 Jan. 28, 2021

(30) Foreign Application Priority Data
Mar. 20, 2018 (EP) ..................... 18162729

(51) Int. Cl.
*H01L 21/311* (2006.01)
*B81C 1/00* (2006.01)
(Continued)

(52) U.S. Cl.
CPC ............ *G04B 17/066* (2013.01); *C23C 14/08* (2013.01); *C23C 16/401* (2013.01); *G04B 17/22* (2013.01); *G04B 17/227* (2013.01); *G04D 3/00* (2013.01)

(58) Field of Classification Search
None
See application file for complete search history.

(56) References Cited

U.S. PATENT DOCUMENTS 4,400,861 A   8/1983   Parker
6,192,603 B1  2/2001   Seita
(Continued)

FOREIGN PATENT DOCUMENTS

CH   703 051 A2   10/2011
EP   0 732 635    9/1996
(Continued)

OTHER PUBLICATIONS

Herrera et al., "SOI-Enabled MEMS Processes Lead to Novel Mechanical, Optical and Atomic Physics Devices," IEEE International SOI Conference Proceedings, 2008, 4 pages.
(Continued)

*Primary Examiner* — Shamim Ahmed
(74) *Attorney, Agent, or Firm* — NIXON & VANDERHYE

(57) ABSTRACT

Disclosed is a method including the following steps: a) providing a substrate including a first silicon layer, a second silicon layer and an intermediate silicon oxide layer therebetween; b) etching the first silicon layer in order to form the timepiece components therein; c) releasing from the substrate a wafer formed by at least all or part of the etched, first silicon layer and including the timepiece components; d) thermally oxidizing and then deoxidizing the timepiece components; e) forming by thermal oxidation or deposition a silicon oxide layer on the timepiece components; f) detaching the timepiece components from the wafer.

17 Claims, 3 Drawing Sheets

(51) Int. Cl.
*G04B 17/06* (2006.01)
*C23C 14/08* (2006.01)
*C23C 16/40* (2006.01)
*G04B 17/22* (2006.01)
*G04D 3/00* (2006.01)

(56) References Cited

U.S. PATENT DOCUMENTS

| | | | |
|---|---|---|---|
| 6,706,202 B1 * | 3/2004 | Sun | B81C 1/00666 216/26 |
| 8,614,110 B1 * | 12/2013 | Waters | B81C 1/00142 257/E23.002 |
| 2007/0026614 A1 | 2/2007 | Choo et al. | |
| 2010/0054089 A1 * | 3/2010 | Maier | G04F 7/08 205/67 |
| 2010/0065946 A1 * | 3/2010 | Wilson | H01L 29/34 438/459 |
| 2010/0214880 A1 | 8/2010 | Rappo et al. | |
| 2010/0290320 A1 * | 11/2010 | Gygax | G04B 17/227 368/177 |
| 2012/0048035 A1 | 3/2012 | Cerutti | |
| 2013/0029157 A1 | 1/2013 | Karapatis | |
| 2013/0051191 A1 | 2/2013 | Schafroth | |
| 2013/0316529 A1 * | 11/2013 | Golda | H01L 21/6835 257/E21.585 |
| 2015/0023140 A1 * | 1/2015 | Daout | G04B 1/145 368/177 |
| 2015/0309474 A1 | 10/2015 | Bossart et al. | |
| 2016/0252506 A1 * | 9/2016 | Daunais | B82Y 10/00 435/7.1 |
| 2016/0351424 A1 | 12/2016 | Fuse et al. | |
| 2017/0115063 A1 | 4/2017 | Liu et al. | |
| 2017/0176940 A1 | 6/2017 | Niedermann et al. | |
| 2021/0003971 A1 | 1/2021 | Maier et al. | |

FOREIGN PATENT DOCUMENTS

| | | |
|---|---|---|
| EP | 1 422 436 | 5/2004 |
| EP | 2 215 531 | 8/2010 |
| EP | 2 423 764 A1 | 2/2012 |
| EP | 2 472 340 A1 | 7/2012 |
| EP | 2 799 939 | 11/2014 |
| EP | 2 937 311 A1 | 10/2015 |
| EP | 3 181 938 | 6/2017 |
| JP | 2011-505003 A | 2/2011 |
| JP | 2014-168819 A | 9/2014 |
| JP | 2015-179013 A | 10/2015 |
| JP | 2015-179067 A | 10/2015 |
| JP | 2016-133495 A | 7/2016 |
| JP | 2016-161394 A | 9/2016 |
| JP | 2016-173355 A | 9/2016 |
| JP | 2016-173356 A | 9/2016 |
| JP | 2016-225429 A | 12/2016 |
| JP | 2017-111131 A | 6/2017 |
| SG | 112005 A1 | 6/2015 |
| WO | 2007/000271 A1 | 1/2007 |
| WO | 2009/068091 | 6/2009 |
| WO | 2010/057777 | 5/2010 |
| WO | 2015/113973 A1 | 8/2015 |
| WO | 2016/128694 | 8/2016 |
| WO | 2019/180558 A1 | 9/2019 |

OTHER PUBLICATIONS

Mohammed et al., "Smoothening of scalloped DRIE trench walls," Materials Science in Semiconductor Processing, vol. 63, 2017, pp. 83-89.
T.M. Fahim Amin, "Design and Fabrication of Micro-electro-mechanical Systems Actuators for Application in External Cavity Tunable Lasers," Thesis, University of Alberta, 2014, 27 pages.
Shi et al., "Improved the Surface Roughness of Silicon Nanophotonic Devices by Thermal Oxidation Method," Journal of Physics: Conference Series, 276 012087, 2011, 7 pages.
AMMT GmbH, "HF Vapor Etcher (HFVE)," Product Information Sheet, 2016, 2 pages.
Clarke, "MEMS scanner projects Bosch Sensortec into displays, user interfaces," Technology News, Feb. 27, 2017, 4 pages.
Anonymous, "Qualcomm Toq smart watch to go for sale on Dec.2, but with entry price of US$349.99, is still expensive luxury," Electronic Times Internet, Nov. 19, 2013, 4 pages.
Sari et al., "A Full Wafer Dicing Free Dry Release Process For MEMS Devices," Proc. Eurosensors XXIV, Procedia Engineering 5, 2010, pp. 850-853.
Fischer et al., "Plastic-deformation in 200 mm silicon wafers arising from mechanical loads in vertical-type and horizontal-type furnaces," Materials Science and Engineering B, 2009, pp. 103-106.
Zickar et al., "Quasi-dry release for micro electro-mechanical systems," 2007, www.idonus.com, 6 pages.
Smith, "Turning wafers upside down," MachineDesign, Apr. 1, 2006, 4 pages.
Anonymous, "PRIMAXX® VHF Etch Release Technology—Dry Vapor HF University/Corporate R&D Tool for Sacrificial SiO2 Etch Release Processing," SPTS Technologies, 2012, 16 pages.
Overstolz et al., "A clean wafer-scale chip-release process without dicing based on vapor phase etching," Proceedings of the IEEE International Conference on Micro Electro Mechanical Systems (MEMS), Feb. 2004, pp. 717-720.
McCreddie-Doak, "This is where Patek Philippe develops the watches of the future," Dec. 31, 2017, 6 pages, https://www.wired.co.uk/article/patek-philippes-aquanaut-travel-time-is-packed-with-innovation.
Aubry, "Theory of escapements," Federation of Technical Schools, Jul. 2016, 13 pages.
Anonymous, "Sidewall Smoothing of Bosch Scallops via Thermal Oxidation," Jun. 2012, 5 pages, http://www.nanofab.ualberta.ca/wp-content/uploads/downloads/2012/06/Sidewall-smoothing-using-thermal-oxidation-steps_2.pdf.
Noell et al., "MEMS for Watches," IEEE, 2004, 4 pages.
International Search Report and Written Opinion of the ISA for PCT/IB2019/052198 dated Aug. 29, 2019, 14 pages.

* cited by examiner

METHOD FOR MANUFACTURING SILICON TIMEPIECE COMPONENTS

This application is the U.S. national phase of International Application No. PCT/IB2019/052198 filed Mar. 19, 2019 which designated the U.S. and claims priority to EP Patent Application No. 18162729.0 filed Mar. 20, 2018, the entire contents of each of which are hereby incorporated by reference.

BACKGROUND OF THE INVENTION

Field of the Invention

The present invention relates to a method for manufacturing timepiece components, such as hairsprings, anchors, wheels, hands, rockers, levers, springs or balances, made of silicon.

Description of the Related Art

Methods for manufacturing silicon timepiece components have been described, notably, in documents EP 0732635, EP 1422436, EP 2215531 and EP 3181938.

SUMMARY OF THE INVENTION

The present invention aims to propose a method for manufacturing high quality silicon timepiece components.

For this purpose, a method according to claim 1 or claim 2 and the claims dependent thereon is provided.

The present invention further proposes a support member which facilitates the implementation of this method and more generally the implementation of a heat treatment of a wafer. This support member is defined in claim 18 and the claims dependent thereon.

BRIEF DESCRIPTION OF THE DRAWINGS

Other characteristics and advantages of the present invention will appear when reading the following detailed description made with reference to the appended drawings in which.

DESCRIPTION OF THE PREFERRED EMBODIMENTS

A method for manufacturing silicon timepiece components, in particular for wristwatches, comprises the successive steps illustrated in FIGS. 1 to 11, according to a particular embodiment of the invention.

In a first step (FIG. 1), a silicon-on-insulator (SOI) type substrate 1 is provided. The substrate 1 comprises an upper silicon layer 2, a lower silicon layer 3 and, in between, an intermediate silicon oxide layer 4. The silicon is monocrystalline, polycrystalline or amorphous. It can be doped or undoped. The thickness of the upper silicon layer 2 is chosen according to the thickness of the components to be produced. The lower silicon layer 3 serves to give the substrate 1 sufficient rigidity to facilitate its handling and the implementation of the operations that will be described below.

Figure 1:
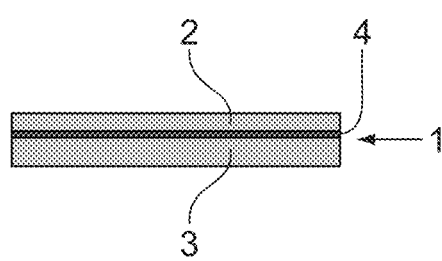
FIGS. 1 to 11 schematically show successive steps of a method according to a particular embodiment of the invention.
Figure 2:
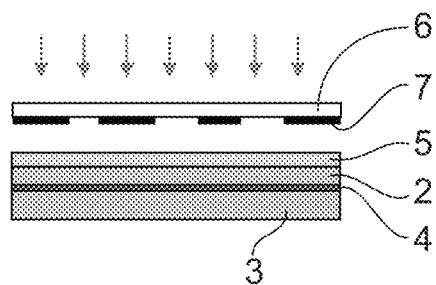
Figure 3:
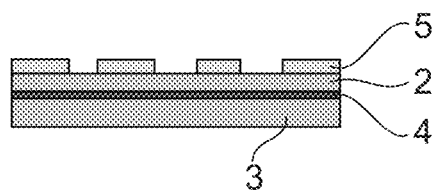
Figure 4:
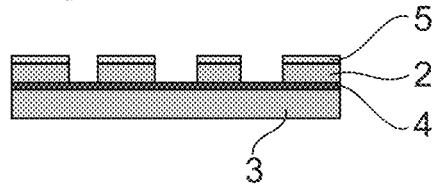

In a second step (FIG. 2), a photoresist layer 5 is deposited on the upper silicon layer 2 and this layer 5 is structured by photolithography. More precisely, the photoresist layer 5 is exposed to ultraviolet rays through a mask 6, typically made of glass or quartz, bearing a structure 7 to be transferred, typically made of chromium. Then the photoresist layer 5 is developed and cured (FIG. 3). At the end of these operations, the photoresist layer 5 has the same shape as the structure 7 and in turn constitutes a mask, the said shape corresponding to that of a batch of timepiece components to be manufactured.

In a subsequent step (FIG. 4), the upper silicon layer 2 is etched through the photoresist mask 5 by deep reactive ion etching (DRIE) in order to form the timepiece components in this layer 2. The etching is stopped by the intermediate silicon oxide layer 4, thus allowing to define a precise thickness for the timepiece components. The etching parameters can be adjusted according to the components, to obtain particular characteristics in terms of roughness or flank angle, for example. The timepiece components formed in the upper silicon layer 2 are preferably identical but could alternatively be divided into several groups, each group corresponding to a type of component. For example, the timepiece components include at least one of the following types of components: hairsprings, anchors, wheels, in particular escapement wheels, hands, rockers, levers, springs, balances, or parts of such components. The method according to the invention is particularly suitable for regulating organ components and more generally for timepiece movement components requiring low mass and/or low inertia.

Figure 5:
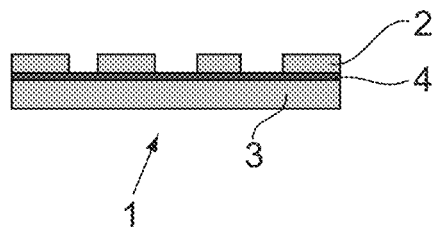
Figure 6:
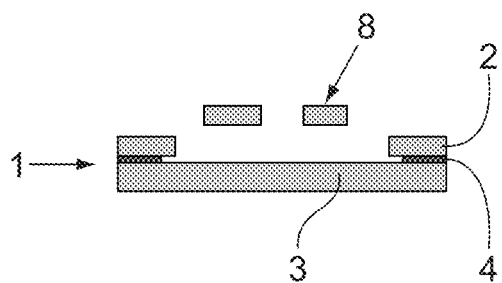

The photoresist mask 5 is then removed by chemical etching or plasma etching (FIG. 5).

In a subsequent step (FIG. 6), a wafer 8 formed by at least all or part of the etched, upper silicon layer 2 is released from the substrate 1 in a manner that will be described later. This wafer 8 contains a basic structure and the timepiece components attached to the basic structure by material bridges left during etching.

Figure 7:
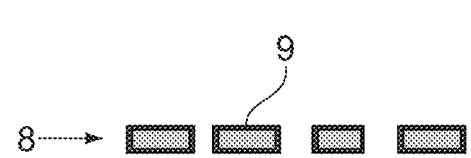
Figure 8:

The wafer 8 is then placed into an oxidation furnace to be subjected to a heat treatment, typically between 600° C. and 1300° C., oxidizing the entire outer surface of the timepiece components (FIG. 7). The silicon oxide (SiO2) layer 9 which then covers the wafer 8 and in particular the timepiece components is formed by consuming silicon from the wafer 8, which causes the interface between the silicon and the silicon oxide to recede and attenuates the surface defects of the silicon. By subsequently removing the silicon oxide (FIG. 8), by wet etching, vapor etching or dry etching, timepiece components with a good surface finish are obtained. In particular, the flank roughness due to the DRIE etching and the surface crystal defects are greatly reduced.

At this stage of the method, it is possible to measure physical characteristics of the timepiece components or of some of them, in particular their dimensions. Thanks to the previous oxidation-deoxidation step, these physical characteristics are well defined and their measurement can therefore be precise, since it is not disturbed by surface defects.

In the case of hairsprings, their stiffness can be determined. For a given hairspring, the stiffness can be determined by coupling the hairspring, while it is still attached to the wafer 8 or detached from the wafer 8, to a balance of predetermined inertia, by measuring the frequency of the balance-hairspring assembly and deducing from this measurement, by calculation, the stiffness of the hairspring. More particularly, the method described in patent application EP 3181938 can be implemented, i.e. determining the stiffness of the hairsprings, calculating a material thickness to be removed from the hairsprings to obtain a desired stiffness, and then removing this material thickness to obtain hairsprings of the desired stiffness. To remove this material thickness, the wafer 8 and its timepiece components can be thermally oxidized (FIG. 9) and then deoxidized (FIG. 10) in the same way as described above with reference to FIGS. 7 and 8. The operations of determining the stiffness, calculating the thickness to be removed and removing this thickness by oxidation—deoxidation can be repeated if necessary to refine the dimensional accuracy of the hairsprings.

In yet another step of the method (FIG. 11), a silicon oxide (SiO2) layer 10 is formed on the wafer 8 and its timepiece components, for example by thermal oxidation or by chemical or physical vapor deposition (CVD, PVD). This silicon oxide layer 10, which coats the timepiece components, increases their mechanical strength. In the case of a hairspring, the silicon oxide layer 10 has a thickness that enables it to compensate for the temperature-dependent variations in the modulus of elasticity of the silicon core as well as the temperature-dependent variations in the moment of inertia of the balance that the hairspring is intended to equip, so that the frequency of the balance-hairspring oscillator is insensitive to temperature, as described in patents EP 1422436 and EP 2215531.

In a final step, the timepiece components are detached from the basic structure of the wafer 8.

Figure 12:
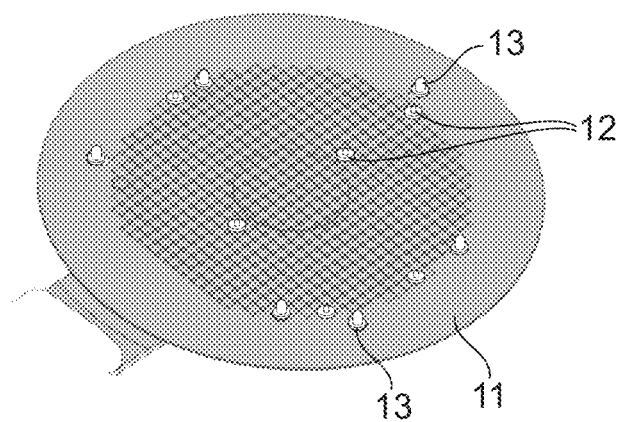
FIGS. 12 and 13 are respectively a perspective view and a profile view of a support member used in the method according to the particular embodiment of the invention to support a silicon wafer during a thermal oxidation treatment of the latter.
Figure 13:
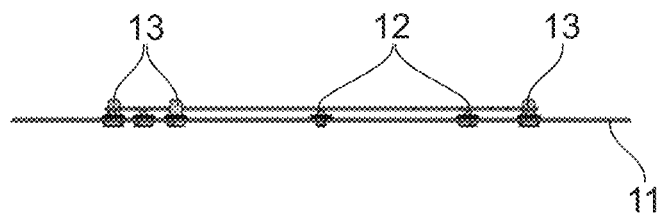

During the oxidation steps (FIGS. 7 and 9 and, if applicable, FIG. 11), the wafer 8 is preferably supported horizontally by a support plate 11 as shown in FIGS. 12 and 13, which can be handled manually or by a robot. This support plate 11 is made of a material compatible with the oxidation treatment, e.g. quartz, silicon or silicon carbide. In order to allow homogeneous oxidation of the wafer 8, the wafer 8 is raised with respect to the support plate 11 by spacers 12 which support the wafer 8 in areas that do not contain any components (especially between the components). The wafer 8 is prevented from moving horizontally by retaining elements 13 which cooperate with the peripheral edge of the wafer 8. The spacers 12 and the retaining elements 13 are generally cylindrical in shape. They are fixed relative to the support plate 11, e.g. attached to the support plate 11 by bayonet-type connections. They are made, for example, of quartz or silicon carbide, and may be made of the same material or of different materials. In a preferred embodiment, the support plate 11 is made of silicon and the spacers and retaining elements 12, 13 are made of quartz. Such a support plate 11 with its spacers 12 and retaining elements 13 can also be used during the step in FIG. 11 when the latter consists of a CVD or PVD deposition operation.

Figure 9:
Figure 10:
Figure 11:
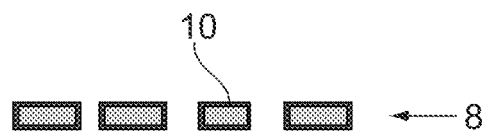

Preferably, during the oxidation treatment of FIG. 9, the wafer 8 is placed on the support plate 11 in an inverted position with respect to the oxidation treatment of FIG. 7. Likewise, during the oxidation or deposition treatment of FIG. 11, the wafer 8 is placed on the support plate 11 in an inverted position with respect to the oxidation treatment of FIG. 9. This prevents or at least limits permanent deformation of the timepiece components under the effect of gravity and heat.

Figure 14:
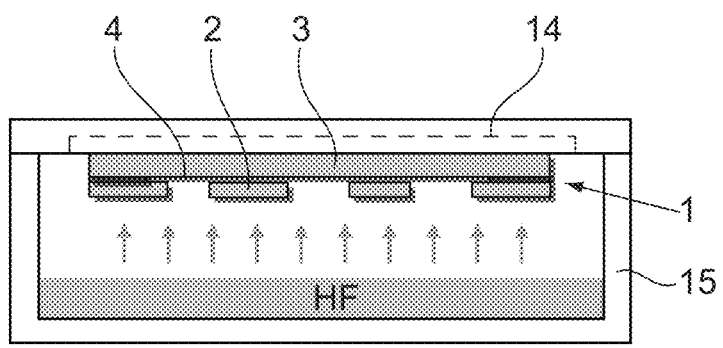
FIGS. 14 and 15 schematically show a step of the method according to the particular embodiment of the invention, in which an etched silicon wafer is released from a composite substrate.

The step of releasing the wafer 8 from the substrate 1 (FIG. 6) can be carried out by removing the entire lower silicon layer 3 and the entire intermediate silicon oxide layer 4 by chemical or plasma etching. Alternatively, the lower silicon layer 3 and the intermediate silicon oxide layer 4 can be removed only at the back of the components or of the component groups, whereby the wafer 8 retains some of these layers 3, 4. However, these operations are time-consuming and expensive. In the present invention, preferably, the wafer 8 is formed by a part of the upper silicon layer 2 and its release from the substrate 1 is carried out in the manner set forth below and illustrated in FIGS. 14 and 15.

The etched substrate 1 as shown in FIG. 5 is fixed against a heating element 14 in a closed chamber 15 (FIG. 14), with the upper silicon layer 2 facing downwards and the lower silicon layer 3, thus facing upwards, being against the heating element 14. The method of fixing the substrate 1 against the heating element 14 can be electrostatic (by applying an electric field) or mechanical. A solution of hydrofluoric acid (HF) is added into the chamber 15, out of contact with the substrate 1. The vapors of the hydrofluoric acid which then saturate the inside of chamber 15 etch the intermediate silicon oxide layer 4, without etching the silicon. The heating element 14, which is temperature-regulated, prevents condensation of the water produced by the reaction between the hydrofluoric acid and the silicon oxide, which condensation would cause the part to be released to stick to the rest of the substrate 1.

Figure 15:
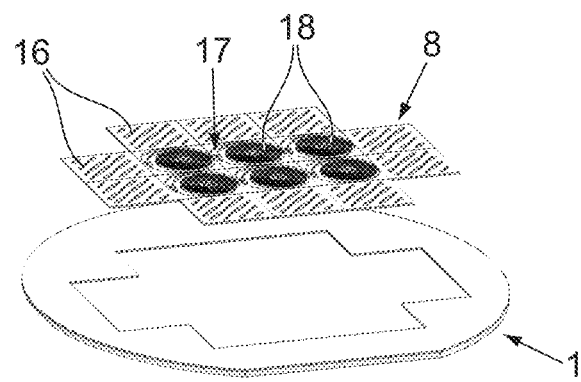

The part to be released, i.e. the wafer 8, is defined beforehand by a groove made during the etching of the upper silicon layer 2 and which forms the peripheral edge of the wafer 8. During this same etching of the upper silicon layer 2, openings 16, e.g. in the form of hatching as shown in FIG. 15, are etched in the wafer 8 around a central area 17 containing the components. These openings 16 allow the passage of the hydrofluoric acid vapor.

FIG. 15 shows an example of wafer 8 with a shape consisting of rectangular or square parts. Other shapes can of course be considered, for example the circular shape. In FIG. 15 can be seen the timepiece components 18, here consisting of hairsprings, carried by the wafer 8. These timepiece components have been represented in a reduced number compared to their real number, in order to facilitate the reading of the drawing.

The timepiece components manufactured by the method according to the invention can have very precise dimensions and good surface finishes which will improve the precision of operation and the performance of the mechanisms that will use them.

Modifications of the method according to the invention as described above are of course possible.

For example, although the two oxidation-deoxidation steps (FIGS. 7, 8 and FIGS. 9, 10) to respectively improve the surface finish of the timepiece components and adjust their stiffness (in the case of hairsprings) are particularly advantageous, only one could be provided, both to improve the surface finish and to adjust the stiffness, which would be preceded by a step of determination of the stiffness.

Figure 16:
FIG. 16 shows a composite substrate from which a method according to another embodiment of the invention can be carried out.

Alternatively, one could start from a double or triple SOI substrate, or even more, i.e. a substrate comprising more than two silicon layers separated by intermediate silicon oxide layers, such as the substrate 20 shown in FIG. 16, and etch the timepiece components in a group of upper layers which would then be released from the substrate. The timepiece components would then have a composite structure comprising one or more intermediate silicon oxide layers.

The photoresist mask 5 that is used to structure the upper silicon layer 2 (FIG. 3) could be replaced by a silicon oxide mask. One could also associate a photoresist mask and a silicon oxide mask to produce multi-level timepiece components by etching in the upper silicon layer or in a group of upper layers.

In other variants, the substrate could be etched from its two sides.

The silicon oxide layer(s) serving to stop the etching could be reinforced by one or more layers of the parylene type.

Finally, the present invention does not exclude the use of one or more metallic layers to stop the etching.

The invention claimed is:

1. A method of manufacturing timepiece components comprising the following steps:
   a) providing a substrate comprising a first silicon layer, a second silicon layer and, in between, an intermediate silicon oxide layer,
   b) etching the first silicon layer to form therein the timepiece components,
   c) releasing from the substrate a wafer formed by at least all or part of the etched, first silicon layer and comprising the timepiece components,
   d) thermally oxidizing and then deoxidizing the timepiece components,
   e) forming by thermal oxidation or deposition a silicon oxide layer on the timepiece components, and
   f) detaching the timepiece components from the wafer.

2. The method according to claim 1, wherein the etching in step b) comprises a deep reactive ion etching.

3. The method according to claim 1, comprising between steps d) and e) an additional step consisting of thermally oxidizing and then deoxidizing the timepiece components.

4. The method according to claim 3, wherein step d) serves to improve the surface finish of the timepiece components and said additional step serves to adjust the stiffness of hairsprings constituting the timepiece components.

5. The method according to claim 3, wherein during the thermal oxidation operation of said additional step the wafer is in an inverted position with respect to the thermal oxidation operation of step d).

6. The method according to claim 3, wherein during step e) the wafer is in an inverted position with respect to the thermal oxidation operation of said additional step.

7. The method according to claim 1, wherein during the thermal oxidation operation the wafer is supported by a support member comprising a support plate and spacers and retaining elements carried by the support plate, the spacers maintaining a gap between the wafer and the support plate, the retaining elements preventing the wafer from moving horizontally.

8. The method according to claim 7, wherein the spacers support the wafer in areas of the wafer not comprising any timepiece component.

9. The method according to claim 7, wherein the support plate is made of silicon, quartz or silicon carbide.

10. The method according to claim 7, wherein the spacers and the retaining elements are made of quartz or silicon carbide.

11. The method according to claim 7, wherein the spacers and the retaining elements are fixed to the support plate by bayonet-type connections.

12. The method according to claim 1, wherein step c) comprises an operation of vapor-phase etching the intermediate silicon oxide layer.

13. The method according to claim 1, wherein the wafer released in step c) is formed by a part of the etched, first silicon layer.

14. The method according to claim 1, wherein in step b) a groove is etched in the first silicon layer in order to define the peripheral edge of the wafer to be released in step c).

15. The method according to claim 1, wherein in step b) openings are etched in the first silicon layer around a central area where the timepiece components are etched, these openings allowing the passage of an etching agent for etching the intermediate silicon oxide layer during step c).

16. The method according to claim 1, wherein the timepiece components comprise at least one of the following types of components: hairsprings, anchors, wheels, hands, rockers, levers, springs, balances, or parts of such components.

17. A method of manufacturing timepiece components comprising the following steps:
   a) providing a substrate comprising silicon layers interleaved with silicon oxide layers,
   b) etching a group of layers of the substrate to form therein the timepiece components,
   c) releasing from the substrate a wafer formed by at least all or part of the group of layers and comprising the timepiece components,
   d) thermally oxidizing and then deoxidizing the timepiece components,
   e) forming by thermal oxidation or deposition a silicon oxide layer on the timepiece components, and
   f) detaching the timepiece components from the wafer.

* * * * *